United States Patent [19]

Bereskin

[11] 4,329,663
[45] May 11, 1982

[54] BACK PLATE MOUNTED LUMPED ELEMENT MICROWAVE OSCILLATOR

[76] Inventor: Alexander B. Bereskin, 452 Riddle Rd., Cincinnati, Ohio 45220

[21] Appl. No.: 132,834

[22] Filed: Mar. 24, 1980

[51] Int. Cl.³ .............................................. H03B 9/12
[52] U.S. Cl. .............................. 331/96; 331/107 DP; 331/107 G
[58] Field of Search .............. 331/96, 107 R, 107 DP, 331/107 G, 117 D, 177 V, 107 SL

[56] References Cited

PUBLICATIONS

Aitchison et al., "Varactor-Tuned X-Band Gunn Oscillator Using Lumped Thin Film Circuits", Electronics Letters, 25 Feb. 1971, vol. 7, pp. 93-94.
Amoss et al., "A Multiband Lumped-Element Varactor-Tuned Gunn Oscillator", 1977 IEEE International Solid-State Circuits Conference, Feb. 17, 1977, pp. 122-123.
Rubin, "Varactor-Tuned Millimeter-Wave MIC Oscillator", IEEE Transactions On Microwave Theory And Techniques, Nov. 1976, pp. 866-867.
Cohen, "Varactor Tuned Gunn Oscillators With Wide Tuning Range", 1979 IEEE MTT-S International Microwave Symposium, Digest of Papers, May 1979, pp. 177-179.

Primary Examiner—Siegfried H. Grimm
Attorney, Agent, or Firm—Wood, Herron & Evans

[57] ABSTRACT

A lumped element microwave oscillator is mounted on the back plate secured to a wave guide for generating electromagnetic waves which propagate through the wave guide. The oscillator includes a two-terminal solid-state device, such as a Gunn diode, which exhibits negative resistance in the microwave range, connected in circuit with a dc source and lumped elements, including a variable capacitive element. The variable capacitive element is accessible without removing the back plate from the wave guide so that the capacitance can be easily adjusted for controlling the frequency of the oscillator. The power of the electromagnetic waves which propagate through the wave guide is preferably controlled by adjusting the coupling between the oscillator and the load in two ways. The physical orientation of various lumped elements mounted on the back plate can be adjusted with respect to the plane of the E field in the wave guide for controlling the coupling between the oscillator and the load in steps. Also, the lateral positional relationship of the back plate with respect to the wave guide can be adjusted for infinitely controlling the coupling between the oscillator and the load.

10 Claims, 8 Drawing Figures

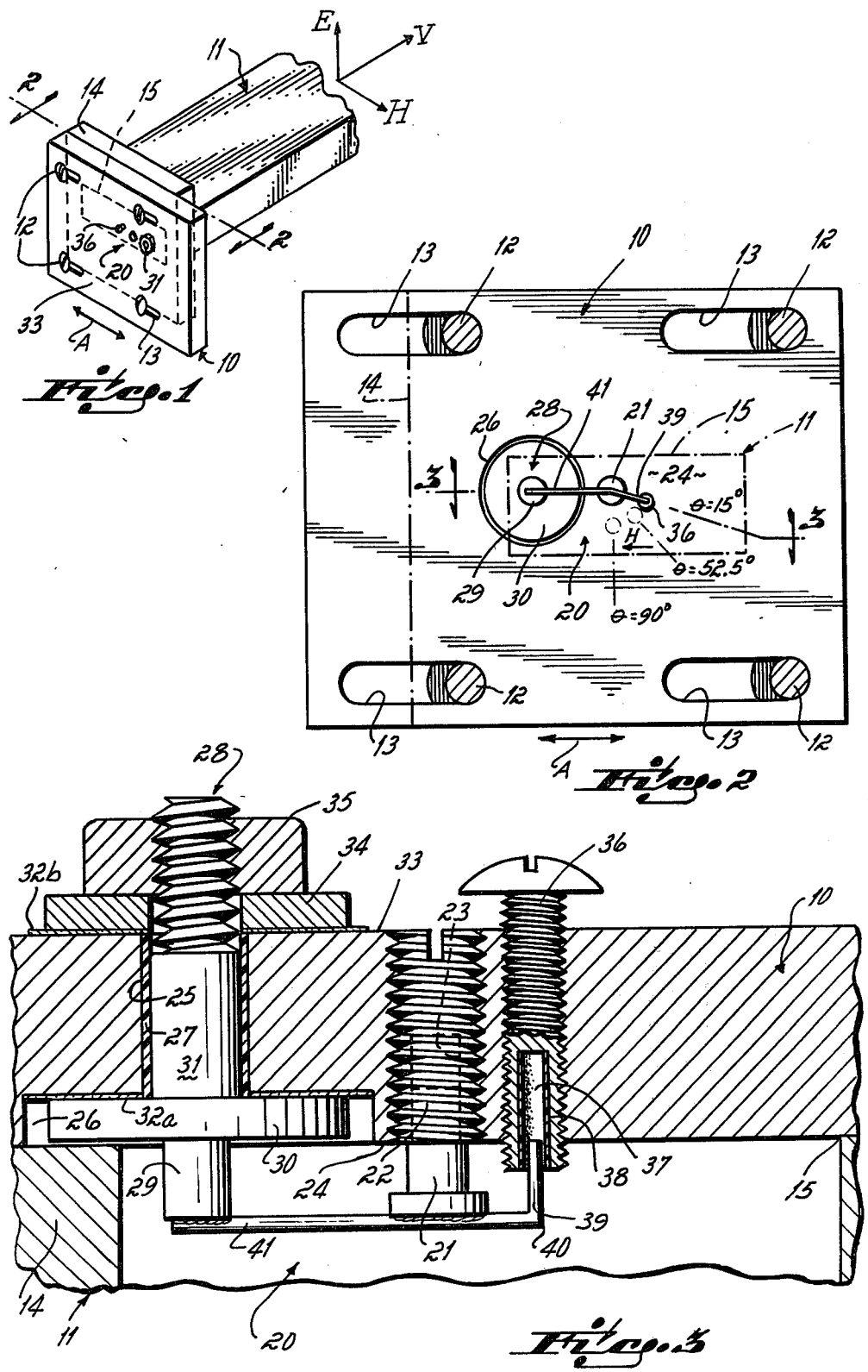

BACK PLATE MOUNTED LUMPED ELEMENT MICROWAVE OSCILLATOR

BACKGROUND OF THE INVENTION

This invention relates to electronic oscillators and, more particularly, to lumped element microwave oscillators, that is, to oscillators comprising distinct electrical components whose physical dimensions are smaller than a wavelength. Specifically, the invention is directed to a lumped element microwave oscillator mounted on the back plate secured to a wave guide and to adjustably controlling the frequency and the power output of the oscillator.

The phenomenon that load variations can change both the frequency and the amplitude of electromagnetic waves generated by a microwave oscillator and transmitted by a wave guide is well known. In fact, various devices have been used in the past for varying the load in order to control the frequency and the amplitude of electromagnetic waves which propagate through a wave guide.

In cavity Gunn diode oscillators, adjustable capacitive tuning screws and inductive posts disposed in the oscillator cavity have been used for controlling the frequency of oscillation. However, lumped element microwave oscillators do not include frequency-determining cavities. Therefore, those types of adjustable capacitive tuning screws and inductive posts cannot be used.

Varactors have been used in lumped element microwave oscillators for controlling the frequency of oscillation as shown, for example, in Rubin, "Varactor-Tuned Millimeter-Wave MIC Oscillator," I.E.E.E. Transactions on Microwave Theory and Techniques, November, 1976, pages 866-867, Amoss et al., "A Multiband Lumped-Element Varactor-Tuned Gunn Oscillator," 1977 I.E.E.E. International Solid-State Circuits Conference, February, 1977, pages 122-123, and Cohen, "Varactor Tuned Gunn Oscillators With Wide Tuning Range For the 25 To 75 GHz Frequency Band," 1979 I.E.E.E. MTT-S International Microwave Symposium, Digest of Papers, May, 1979, pages 177-179. A varactor is a two-terminal solid-state device which exhibits a voltage-variable capacitance across a p-n junction, and the varactor capacitance can be adjusted by altering the applied voltage.

The use of varactors in a lumped element microwave oscillator provides control over a suitable, but narrow, range of frequencies. However, the applied voltage must be altered in order to adjust the varactor capacitance for controlling the oscillator frequency which is a disadvantage.

In the past, the power output of the oscillator has been controlled by adjusting the coupling between the oscillator and the load by means of various devices. Passive attenuators, such as resistive cards and irises, have been mounted in the wave guide for controlling the coupling between the oscillator and the load. In addition to the passive attenuators, active attenuators, such as pin diodes, mounted in the wave guide have also been used for controlling the coupling between the oscillator and the load.

The use of passive attenuators, such as resistive cards and irises, or active attenuators, such as pin diodes, has certain disadvantages. Provision must be made in the structure of the wave guide for the use of such devices which increases the cost of the wave guide. Furthermore, the passive attenuators must be carefully constructed and precisely oriented in the wave guide for controlling the coupling between the oscillator and the load. Adjustment of the orientation of a passive attenuator within a wave guide can be difficult. The use of an active attenuator, such as a pin diode, requires a dc source for biasing the diode which adds further expense.

SUMMARY OF THE INVENTION

One objective of the invention is to provide a lumped element microwave oscillator mounted on the back plate secured to a wave guide.

Another objective is to provide an easily adjustable variable capacitive element of economical construction for controlling the frequency of a lumped element microwave oscillator.

A further objective is to provide improved ways for controlling the coupling between a microwave oscillator and the load.

In accordance with the invention, a lumped element microwave oscillator is mounted on the back plate secured to a wave guide for generating electromagnetic waves which propagate through the wave guide. The oscillator includes a two-terminal solid-state device, such as a Gunn diode, which exhibits negative resistance in the microwave range, connected in circuit with a dc source and lumped elements, including a variable capacitive element. The variable capacitive element is accessible without removing the back plate from the wave guide so that the capacitance can be easily adjusted for controlling the frequency of the oscillator. The power of the electromagnetic waves which propagate through the wave guide is preferably controlled by adjusting the coupling between the oscillator and the load in two ways. The physical orientation of various lumped elements mounted on the back plate can be adjusted with respect to the plane of the E field in the wave guide for controlling the coupling between the oscillator and the load in steps. In a preferred embodiment, a loop included in the oscillator is oriented at a preselected angular position with respect to the plane of the E field for adjusting the coupling between the oscillator and the load. Also, the positional relationship of the back plate with respect to the wave guide can be adjusted for infinitely controlling the coupling between the oscillator and the load. In the preferred embodiment, slots are provided in the back plate, and the back plate is shifted laterally for adjusting the coupling between the oscillator and the load. The physical orientation of the oscillator loop is adjustable for varying the coupling in steps and/or the lateral position of the back plate with respect to the wave guide is adjustable for infinitely varying the coupling.

The variable capacitive element included in the microwave oscillator of the invention facilitates adjustment of the oscillator frequency without removing the back plate from the wave guide and does not have the disadvantage of a varactor which requires that the applied voltage be altered in order to adjust the oscillator frequency. Controlling the coupling between the oscillator and the load by adjusting the physical orientation of the oscillator elements with respect to the plane of the E field in the wave guide and/or by shifting the back plate with respect to the wave guide supplants the need for a conventional attenuator which is relatively expensive and difficult to use.

BRIEF DESCRIPTION OF THE DRAWINGS

The above and other features of the back plate mounted lumped element microwave oscillator of the invention and the concomitant advantages will be better understood by those skilled in the art after consideration of the following description which is given in connection with the accompanying drawings. In the drawings:

FIG. 1 is an isometric view of the lumped element microwave oscillator of the invention mounted on the back plate secured to a wave guide;

FIG. 2 is a view taken along line 2—2 in FIG. 1;

FIG. 3 is a cross-sectional view taken along line 3—3 in FIG. 2;

DESCRIPTION

Figure 4:
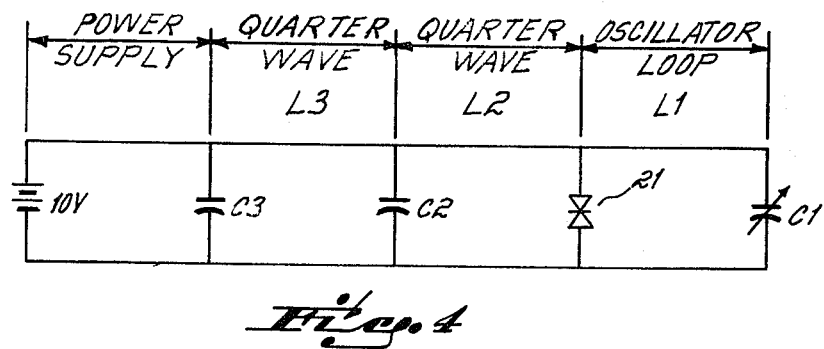
FIG. 4 is a schematic for the circuit of the oscillator shown in FIGS. 1-3.

In accordance with the preferred embodiment of the invention, a back plate 10 is secured to the transmitting end of a wave guide 11 by means of bolts or the like 12 which pass through slots 13 in the back plate and screw into threaded holes provided in a flange 14 of the wave guide as shown in FIG. 1. The intersection of wave guide 11 with back plate 10 is indicated by phantom lines 15 in FIGS. 1 and 2.

As shown in FIGS. 1 and 2, slots 13 in the back plate 10 allow adjustment of the positional relationship of the back plate with respect to wave guide 11 by initially loosening bolts 12, by next shifting the back plate laterally in either direction as indicated by the arrow A, and by then re-tightening the bolts. Slots 13 make possible lateral movement of back plate 10 with respect to wave guide 11 over a distance of approximately 0.40 inch, for example. The purpose for shifting back plate 10 with respect to wave guide 11 will be described later.

The lumped element microwave oscillator is indicated generally by the numeral 20 in FIGS. 1 and 2. Oscillator 20 is mounted on back plate 10 so that when the back plate is secured to wave guide 11 electromagnetic waves generated by oscillator 20 propagate through the wave guide in the direction of the arrow V in FIG. 1.

When back plate 10 is removed from wave guide 11, all elements of oscillator 20 are readily accessible. Accessibility of the elements facilitates initial construction of oscillator 20 or troubleshooting and repair after the oscillator is placed in use.

Oscillator 20 is shown in greater detail in FIG. 3. Oscillator 20 preferably includes a Gunn diode 21 held in place by a chuck 22. Chuck 22 may be constructed in any manner. For example, a #6-40 copper screw may be screwed into a threaded hole in back plate 10 so that the tip of the screw initially extends beyond the face 24 of the back plate. Chuck 22 is then formed by drilling a cavity 23 in the tip of the screw and subsequently tapering the thread out at the tip. Gunn diode 21 is thereafter pressed into cavity 23, and the screw is retracted until the tip of the screw is flush with face 24 of back plate 10 which causes the Gunn diode to be firmly gripped.

A bore 25 is drilled through back plate 10, and a countersink 26 centered about the bore is machined in face 24 of the back plate. Bore 25 may be 0.1360 inch in diameter, and countersink 26 may be 7/16 inch in diameter. The depth of countersink 26 may be 0.060 inch. As shown in FIG. 3, bore 25 is preferably lined with a teflon sleeve 27 or other dielectric material which may be 0.010 inch in thickness.

Oscillator 20 also includes a member 28 constructed from conductive material such as brass. Member 28 has a cylindrical head 29 integral with a cylindrical shoulder 30. Shoulder 30 may be 0.050 inch thick and ⅜ inch in diameter, for example. Shoulder 30 is integral with a cylindrical body 31 which is threaded at the distal end.

During assembly of oscillator 20, an annular piece of mica or other dielectric material 32a which may be 0.0020 inch thick and have a 0.1360 inch diameter central opening is placed in the bottom of countersink 26. Body 31 is pushed through sleeve 27 which lines bore 25 in back plate 10. A second annular piece of mica or other dielectric material 32b having a 0.1360 inch diameter central opening and a thickness of 0.0020 inch is then sandwiched between the back 33 of back plate 10 and a conductive washer or spacer 34 which is slipped over the threaded end of body 31. Finally, a nut 35 is rotated onto the threaded end of body 31 for anchoring member 28.

Head 29 has a smaller diameter than shoulder 30. Also, shoulder 30 is recessed 0.0080 inch, for example, below face 24. Consequently, back plate 10 may be shifted with respect to wave guide 11 as shown by the arrow A in FIGS. 1 and 2 without member 28 having electrical contact with the wave guide.

As shown in FIG. 3, oscillator 20 also includes a coaxial tuning screw 36 disposed in a threaded hole in back plate 10. Tuning screw 36 preferably comprises a #2-56 copper screw whose tip is drilled to form a recess 37. Recess 37 preferably has a liner 38 formed by Teflon sheathing obtained from Teflon-insulated hook-up wire.

Oscillator 20, as shown in FIG. 3, also includes a hairpin loop 39 preferably constructed from bare #24 tinned copper wire. Loop 39 has a right angle bend 40 located directly over the center of recess 37 in tuning screw 36. The tip of loop 39 terminates flush with face 24 of back plate 10. Loop 39 is soldered to Gunn diode 21. The distance between the center of the threaded hole into which chuck 22 is screwed and the threaded hole in which tuning screw 36 is disposed may be 0.1250 inch.

As shown in FIG. 3, tuning screw 36 may be rotated so that the tip of the tuning screw having recess 37 is moved toward or away from loop 39. Tuning screw 36 including recess 37 and liner 38 together with loop 39 form a variable capacitive element, that is, a coaxial variable capacitor. As shown in FIGS. 1 and 3, tuning screw 36 is readily accessible without removing back plate 10 from wave guide 11 so that the capacitance of the variable capacitive element can be adjusted easily by means of a screwdriver for controlling the oscillator frequency.

An extension 41 constructed from conductive material, such as #24 tinned copper wire, is soldered to Gunn diode 21 and to head 29 as shown in FIG. 3. The distance between the center of bore 25 and the threaded hole into which chuck 22 is screwed may be 0.30 inch.

As shown in FIG. 2, loop 39 may be physically oriented at a preselected angular position with respect to the plane of the H field indicated by the arrow labeled H in FIGS. 1 and 2. As shown by the solid circle in FIG. 2, the threaded hole in which tuning screw 36 is disposed is at an angle $\theta = 15$ degrees with respect to the plane of the H field. However, an angle $\theta = 52.5$ degrees or 90 degrees, for example, may be chosen instead as shown by the phantom circles in FIG. 2.

The threaded hole in which tuning screw 36 is disposed can be located so that loop 39 is physically oriented at any angular position with respect to the plane of the H field. The greatest coupling between oscillator 20 and the load results when the threaded hole in which tuning screw 36 is disposed is at $\theta = 90$ degrees, and no coupling would result if the threaded hole was at $\theta = 0$ degrees. After a threaded hole is chosen for tuning screw 36, the coupling may be infinitely adjusted by loosening bolts 12, laterally shifting back plate 10 along slots 13, and re-tightening the bolts.

The electrical circuit for oscillator 20 is shown in FIG. 4. Oscillator 20 is excited by a dc source, such as a 10 VDC battery, preferably having a positive terminal connected to the threaded end of body 31 and a negative terminal connected anywhere to back plate 10.

Oscillator 20 includes a series resonant circuit comprising an inductor $L_1$ formed by loop 39 and a capacitor $C_1$ formed by the variable capacitive element 36–39 connected in series across Gunn diode 21. The resonant circuit $L_1$, $C_1$ is excited through extension 41.

Extension 41 is approximately a quarter wavelength long and forms an inductor $L_2$ included in a low pass filter through which the dc power is supplied. The other inductor $L_3$ included in the low pass filter is formed by body 31. The length of body 31 including the effect of sleeve 27 is also approximately a quarter wavelength long. The shunting capacitors $C_2$ and $C_3$ of the low pass filter are formed respectively by shoulder 30 which is insulated from back plate 10 by mica 32a and by washer 34 which is insulated from the back plate by mica 32b. The diameter of shoulder 30 as well as the diameter of washer 34, including the effect of the mica, are each approximately a half wavelength in diameter. The dc feed circuit does not couple into wave guide 11 because the dc feed circuit is at right angles to the plane of the E field.

In operation, current oscillations occur at a radio-frequency rate when an electric field of about 3,000 volts per centimeter is applied to Gunn diode 21 which comprises a short (0.0050 inch or less) specimen of n-type gallium arsenide. Oscillations take place because electrons under the influence of sufficiently high fields are transferred from high- to low-mobility valleys in the conduction band of the gallium arsenide. The frequency of the oscillations is partially determined by the oscillator resonant circuit.

Figure 5:
FIG. 5 is a block diagram of a circuit for measuring the frequency and the power output of the oscillator shown in FIGS. 1-3.
Figure 6:
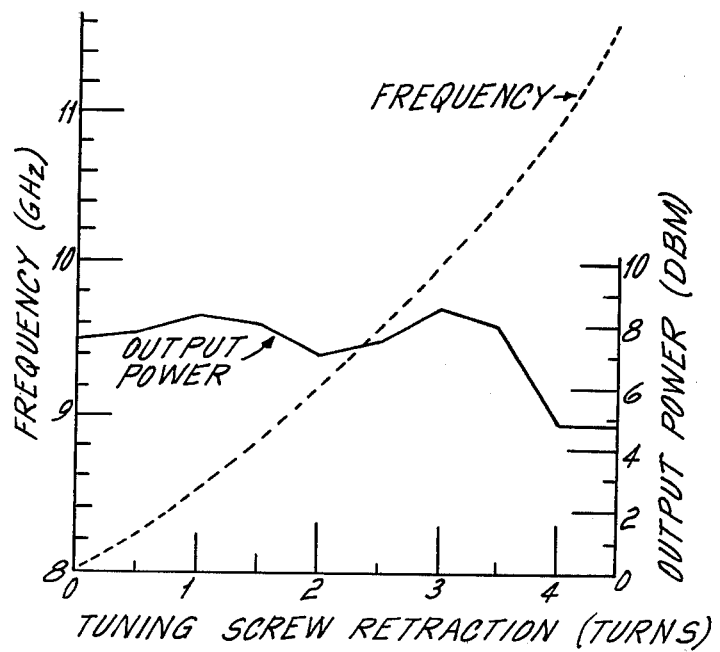
FIG. 6 is a plot of the frequency and the power output of the oscillator shown in FIGS. 1-3 as a function of the adjustment of a variable capacitive element included in the oscillator.
Figure 7:
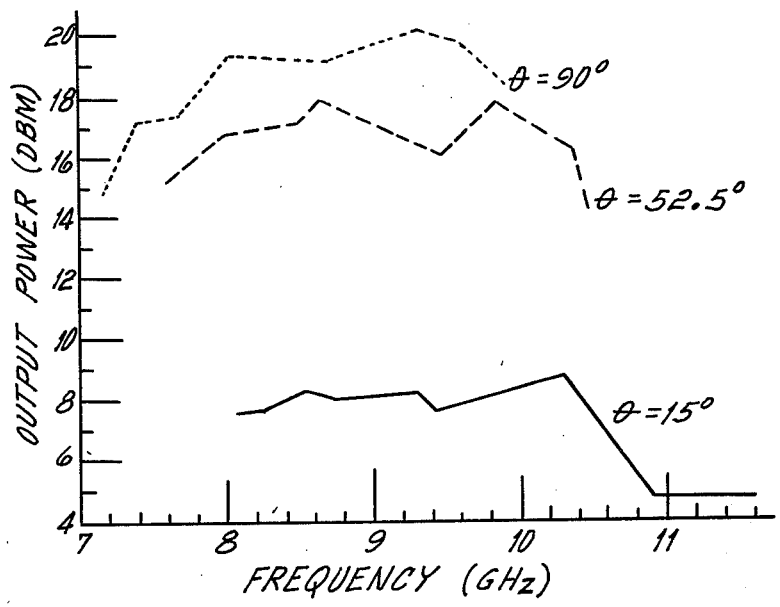
FIG. 7 is a plot of the power output of the oscillator shown in FIGS. 1-3 as a function of frequency for various discrete adjustments of the physical orientation of various lumped elements of the oscillator with respect to the plane of the H field in the wave guide.
Figure 8:
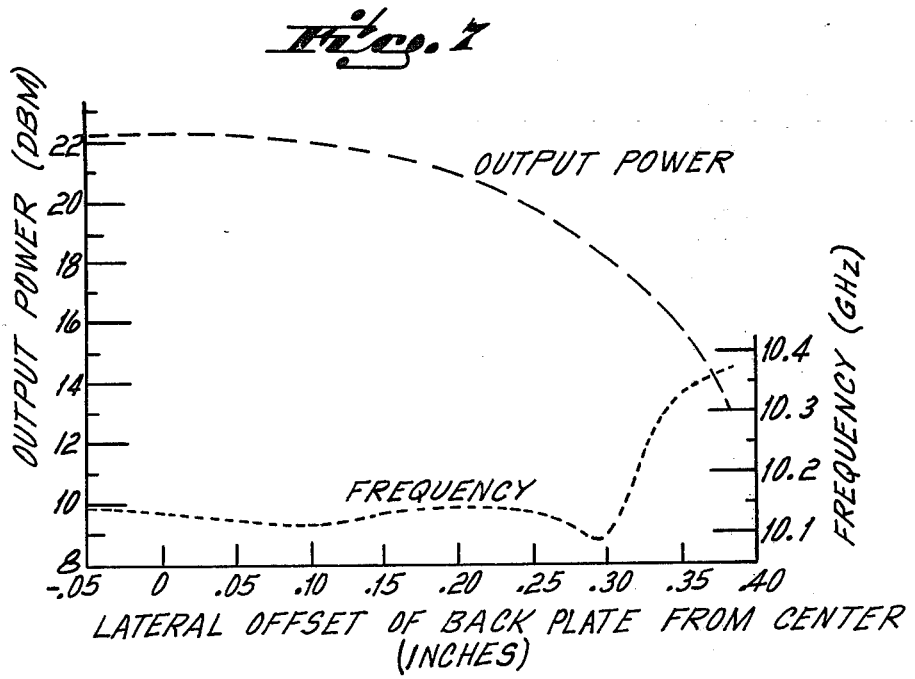
FIG. 8 is a plot of the frequency and the power output of the oscillator shown in FIGS. 1-3 as a function of the adjustment of the lateral positional relationship of the back plate with respect to the wave guide for a given physical orientation of the oscillator elements.

The data represented by the plots in FIGS. 6–8 were obtained by the measurement circuit shown in FIG. 5. The Hewlett-Packard Company (HP) X382 attenuator was set permanently at 20 dB. After each circuit adjustment indicated by FIGS. 6–8, the HP X880A E-H tuner and the wave meter were adjusted until a peak deflection was indicated by the HP 431C power meter. The peak values of power output are plotted in FIGS. 6–8. The frequency values were calculated on the basis of the average of five successive singularities resulting from adjustment of the wave meter. In most cases, the deviations of the singularities from the averaged frequency values were on the order of a few parts in 10,000.

The plot shown in FIG. 6 was obtained using a GE Type Y-2140C Gunn diode with the threaded hole in which tuning screw 36 was disposed at $\theta = 15$ degrees. At zero turns retraction, tuning screw 36 was fully extended beyond face 24 of back plate 10 and just failed to contact loop 39 in the vicinity of bend 40. Tuning screw 36 was flush with face 24 of back plate 10 when the tuning screw was retracted approximately 4.5 turns. No further frequency variation resulted with additional retraction of tuning screw 36. The frequency curve shown in FIG. 6 represents a smooth curve through the average of the measured frequency values. The frequency range shown in FIG. 6 is from 8.1 GHz to 11.6 GHz with a power output between 5 and 9.5 dBm where dBm is the quantity of power expressed in terms of its ratio to one milliwatt.

The plot shown in FIG. 7 illustrates the amount by which the power output was controlled by adjusting the location of the threaded hole in which tuning screw 36 was disposed from $\theta = 15$ degrees to 90 degrees. The curve for $\theta = 15$ degrees shown in FIG. 7 is the same as that shown in FIG. 6 except that the plotting variables have been altered. The frequency spans of the three curves shown in FIG. 7 do not coincide because a change in the coupling angle $\theta$ required that the previous loop 39 be unsoldered and discarded and a new loop soldered into place. No effort was made to keep the loops identical. Overall, a frequency span of about 1.4:1 was achieved between 7.2 GHz and 11.6 GHz with the given Gunn diode by properly sizing loop 39 with the relative power outputs being proportional to the square of the sine of $\theta$. On the average, disregarding minor variations, the curve for $\theta = 52.5$ degrees should be four dB below the value of the curve for $\theta = 90$ degrees which is the maximum value curve, and the curve for $\theta = 15$ degrees should be 12 dB below the maximum value curve. The $\theta = 15$ degrees curve represents a substantial decoupling of the oscillator from the load.

The plot shown in FIG. 8 was obtained using an Alpha DGB6835D Gunn diode with the threaded hole in which tuning screw 36 was disposed at $\theta = 90$ degrees and with the tuning screw held in a fixed position. The variable was the positional relationship of back plate 10 with respect to wave guide 11. At 0.30 inch lateral offset from center, loop 39 was approximately 45 electrical degrees from the side wall of wave guide 11. The square of the sine of 45 degrees corresponds to half power output which is reasonably close to the value measured. At 0.380 inch lateral offset from center, loop 39 was 21 electrical degrees from the side wall of wave guide 11. The square of the sine of 21 degrees corresponds to a power output nine dB below maximum which is also reasonably close to the value measured. The finite dimensions of Gunn diode 21 and loop 39 make it unreasonable to expect any closer agreement.

As can be seen by the plot shown in FIG. 8, initially only a minor variation of the oscillator frequency was observed as back plate 10 was shifted away from center. However, a substantial variation resulted as loop 39 approached the side wall of wave guide 11. Of course, for any position of back plate 10, tuning screw 36 could have been adjusted so that oscillations occurred at the frequency desired.

The maximum power outputs of the two different Gunn diodes used to obtain the data plotted in FIGS. 6–8 agree with the manufacturers' specifications. In both cases, the power outputs correspond to about three percent efficiency.

The use of the variable capacitive element comprising tuning screw 36 including recess 37 and liner 38 together with loop 39 which form a coaxial variable capacitor provides a very convenient method for adjusting the frequency of a lumped element microwave oscillator. A lock nut could be used in combination with tuning screw 36 to provide a fixed frequency setting. The use of different locations for the threaded hole in which tuning screw 36 is disposed and/or the use of a back plate which includes slots 13 so that the back plate can be shifted with respect to the wave guide provide a very straightforward and economical method for adjusting the coupling between the oscillator and the load. By use of the latter method, a power output slightly higher than that required can be established by choosing a desired location for the threaded hole in which the tuning screw is disposed, and the precise power output desired can be established by shifting the back plate.

A preferred embodiment of the back plate mounted lumped element microwave oscillator of the invention has been described, and a preferred construction, including dimensions, has been disclosed by way of example and not by way of limitation. The dimensions of the various elements of the oscillator could vary depending on the desired frequency range over which the oscillator is intended to operate.

While the preferred embodiment includes a coaxial variable capacitor as the variable capacitive element, a contemplated modification would be to use a varactor instead. Physically orienting the loop with respect to the plane of the E field and shifting the back plate could then be used for controlling the coupling between the oscillator and the load in accordance with the other features of the invention. Furthermore, any two-terminal solid-state device which exhibits negative resistance in the microwave range could be used as a substitute for the Gunn diode.

Other modifications might be apparent to those skilled in the art without departing from the spirit of the invention. Therefore, reference should be had to the appended claims in order to ascertain the true scope of the invention.

I claim:

1. In a lumped element microwave oscillator mounted on the back plate secured to an end of a wave guide which is coupled to a load, the oscillator including a two-terminal solid-state device which exhibits negative resistance in the microwave range, the improvement comprising:
   a capacitive means mounted on the back plate; and
   a loop mounted on the back plate, the loop and the capacitive means comprising a resonant circuit connected to the two-terminal solid-state device;
   the angular orientation of the loop with respect to the plane of the E field in the wave guide being chosen for the coupling desired between the oscillator and the load.

2. In a lumped element microwave oscillator mounted on the back plate secured to an end of a wave guide which is coupled to a load, the oscillator including a two-terminal solid-state device which exhibits negative resistance in the microwave range, the improvement comprising:
   a capacitive means mounted on the back plate;
   a loop mounted on the back plate, the loop and the capacitive means comprising a resonant circuit connected to the two-terminal solid-state device; and
   means for continuously adjusting the positional relationship of the back plate with respect to the wave guide for controlling the coupling between the oscillator and the load.

3. The lumped element microwave oscillator in claim 1 further comprising means for continuously adjusting the positional relationship of the back plate with respect to the wave guide for controlling the coupling between the oscillator and the load.

4. The lumped element microwave oscillator in claim 1, 2, or 3 wherein the capacitance of the capacitive means is adjustable for controlling the frequency of oscillation.

5. The lumped element microwave oscillator in claim 4 wherein the adjustable capacitive means is a varactor.

6. The lumped element microwave oscillator in claim 4 wherein the adjustable capacitive means is a coaxial variable capacitor comprising:
   a tuning screw disposed in a threaded hole in the back plate;
   a recess formed in the tip of the tuning screw, the loop having a bend located over the recess; and
   a liner of dielectric material disposed in the recess;
   the tuning screw being movable with respect to the loop for adjusting the capacitance of the coaxial variable capacitor for controlling the frequency of oscillation.

7. The lumped element microwave oscillator in claim 2 or 3 wherein the wave guide includes a flange and wherein the means for continuously adjusting the positional relationship of the back plate with respect to the wave guide for controlling the coupling between the oscillator and the load comprises:
   slots formed in the back plate; and
   bolts passed through the slots and screwed into threaded holes in the flange for securing the back plate to the wave guide;
   the back plate being movable with respect to the wave guide by initially loosening the bolts and by then shifting the back plate along the slots.

8. A back plate mounted lumped element microwave oscillator, comprising:
   a back plate secured to an end of a wave guide which is coupled to a load;
   a two-terminal solid-state device mounted on the back plate, the two-terminal solid-state device exhibiting negative resistance in the microwave range;
   a sleeve disposed in a bore in the back plate;
   a first annular piece of dielectric material disposed in a countersink centered about the bore on the face of the back plate;
   a member having a head, a shoulder, and a body with a threaded end, the body being pushed through the sleeve so that the shoulder is disposed in the countersink, the first annular piece of dielectric material being sandwiched between the countersink and the shoulder;

a second annular piece of dielectric material slipped over the threaded end of the body;

a washer slipped over the threaded end of the body, the second annular piece of dielectric material being sandwiched between the rear face of the back plate and the washer;

a nut rotated onto the threaded end of the body for anchoring the member;

a tuning screw disposed in a threaded hole in the back plate;

a recess formed in the tip of the tuning screw;

a liner of dielectric material disposed in the recess;

a loop soldered to the two-terminal solid-state device, the loop having a bend located over the recess; and an extension soldered to the two-terminal solid-state device and to the head;

the tuning screw being movable with respect to the loop for adjusting the capacitance for controlling the frequency of oscillation.

9. The back plate mounted lumped element microwave oscillator in claim 8 wherein the angular orientation of the loop with respect to the plane of the E field in the wave guide is adjustable for controlling the coupling between the oscillator and the load by choosing the location of the threaded hole in which the tuning screw is disposed.

10. The back plate mounted lumped element microwave oscillator in claim 8 or 9 wherein the wave guide includes a flange and further comprising:

slots formed in the back plate; and bolts passed through the slots and screwed into threaded holes in the flange for securing the back plate to the wave guide;

the back plate being movable with respect to the wave guide by initially loosening the bolts and by then shifting the back plate along the slots for continuously adjusting the positional relationship of the back plate with respect to the wave guide for controlling the coupling between the oscillator and the load.

* * * * *